(12) United States Patent
Kerrigan et al.

(10) Patent No.: US 9,877,416 B2
(45) Date of Patent: Jan. 23, 2018

(54) HEAT MANAGEMENT IN A SERVER RACK (71) Applicant: LENOVO Enterprise Solutions (Singapore) PTE. LTD., New Tech Park (SG)

(72) Inventors: Brian Kerrigan, Cary, NC (US); Jason A. Matteson, Raleigh, NC (US); Edward J. McNulty, Raleigh, NC (US); Mark Edward Steinke, Durham, NC (US)

(73) Assignee: LENOVO ENTERPRISE SOLUTIONS (SINGAPORE) PTE. LTD., New Tech Park (SG)

( * ) Notice: Subject to any disclaimer, the term of this patent is extended or adjusted under 35 U.S.C. 154(b) by 66 days.

(21) Appl. No.: 14/834,343

(22) Filed: Aug. 24, 2015

(65) Prior Publication Data

US 2017/0064873 A1  Mar. 2, 2017

(51) Int. Cl.
*H05K 7/20* (2006.01)
(52) U.S. Cl.
CPC .............. *H05K 7/20781* (2013.01)
(58) Field of Classification Search
CPC ............................... H05K 7/20781
USPC .................... 361/699, 696; 62/440
See application file for complete search history.

(56) References Cited

U.S. PATENT DOCUMENTS

| | | | | |
|---|---|---|---|---|
| 6,819,563 B1* | 11/2004 | Chu | ........... | G11B 33/1406 165/104.33 |
| 8,437,129 B2* | 5/2013 | Tung | ........... | H05K 7/20772 165/80.4 |
| 8,493,738 B2* | 7/2013 | Chainer | ........... | H05K 7/20772 361/679.53 |
| 8,804,334 B2* | 8/2014 | Eckberg | ........... | H05K 7/2079 165/104.33 |
| 2009/0120622 A1* | 5/2009 | Koch | ........... | H05K 7/20781 165/104.33 |
| 2011/0240281 A1* | 10/2011 | Avery | ........... | G05D 23/1917 165/287 |
| 2015/0208549 A1* | 7/2015 | Shedd | ........... | H05K 7/20327 165/104.27 |

* cited by examiner

*Primary Examiner* — Dion R Ferguson
*Assistant Examiner* — Mandeep S Buttar
(74) *Attorney, Agent, or Firm* — Kunzler, PC.

(57) ABSTRACT

Systems, apparatuses, and methods are disclosed for heat management in a server rack. A server rack includes devices and a direct cooling element. A door coupleable to the server rack includes fluid-conducting conduits. An intake hose is coupled to a first fluid-conducting conduit and a fluid supply. The intake hose is coupleable to a fluid supply located below and above the server rack. An intermediate hose is coupled to a second fluid-conducting conduit and the direct cooling element. A return hose is coupled to a fluid return line and the direct cooling element. The return hose is coupleable to a fluid return line located below and above the server rack. The intake hose, the fluid-conducting conduits, the intermediate hose, the direct cooling element, and the return hose are connected to create a single path for the fluid.

20 Claims, 6 Drawing Sheets

HEAT MANAGEMENT IN A SERVER RACK

FIELD

The subject matter disclosed herein relates to server racks and more particularly relates to heat management in a server rack.

BACKGROUND

Description of the Related Art

Data centers may include multiple server racks that house a number of servers, or similar devices. The devices within the server racks may produce a large amount of heat. Data centers may include various ways to control the climate with the data center to reduce the heat load within the data center, including air conditioners, fans, etc. Rear door heat exchangers may be fluid-based cooling components connected to a server rack to dissipate heat from the server rack. Conventional rear door heat exchangers, however, may not alone be sufficient to reduce the heat load within a server rack to acceptable levels. Thus additional fans or air conditioners may be required. Furthermore, typical rear door heat exchangers may only be capable of connecting to fluid supply and return lines located in either a ceiling or a floor, but not both.

BRIEF SUMMARY

Systems, apparatuses, and methods for heat management in a server rack is disclosed. In one embodiment, a system includes a server rack that includes a direct cooling element. In a further embodiment, a system includes a door coupleable to the server rack. The door may include a plurality of fluid-conducting conduits.

A system, in another embodiment, includes an intake hose that includes a first end coupled to the door and a second end coupled to a fluid supply. In some embodiments, the intake hose is coupleable to a fluid supply located below the server rack and to a fluid supply located above the server rack. A system, in certain embodiments, includes an intermediate hose that includes a first end coupled to the door and a second end coupled to the direct cooling element.

A system, in various embodiments, includes a return hose that includes a first end coupled to a fluid return line and a second end coupled to the direct cooling element. In some embodiments, the return hose is coupleable to a fluid return line located below the server rack and a fluid return line located above the server rack. In one embodiment, the intake hose, the fluid-conducting conduits, the intermediate hose, the direct cooling element, and the return hose are connected to create a single path for the fluid.

In some embodiments, heat within the server rack is directed to the fluid-conducting conduits of the door using one or more fans integrated into one or more devices within the server rack. The server rack, in a further embodiment, is free from additional fans not integrated into the devices within the server rack. In another embodiment, the door selectively couples to a rear side of the server rack. In various embodiments, the intake hose and the intermediate hose are located along a side of the door that is not coupled to the server rack.

In one embodiment, the fluid supply and the fluid return line are located together in one or more of a floor below the server rack and a ceiling above the server rack. In certain embodiments, an amount of heat dissipated through the direct cooling element and the plurality of fluid-conducting conduits of the door is about 100 percent of a heat load generated by one or more devices within the server rack. In another embodiment, the server rack is room-neutral such that a heat load of the server rack is below a level in which climate control settings of an area where the server rack is installed would be adjusted. In various embodiments, a system includes one or more connectors coupled to each end of the hoses that couple the hoses to the fluid supply, the door, the direct cooling element, and the fluid return line without threading.

In one embodiment, a system includes one or more of a plug and a valve configured to prevent an outflow of the fluid from an end of the intake hose that is not coupled to the fluid supply and an end of the return hose that is not coupled to the fluid return line. In some embodiments, the rate of flow of the fluid is about nine gallons per minute. In a further embodiment, the fluid comprises water cooled to a predetermined temperature.

An apparatus, in one embodiment, includes a door coupleable to the server rack. The door may include a plurality of fluid-conducting conduits. An apparatus, in another embodiment, includes an intake hose that includes a first end coupled to a first conduit of the fluid-based conduits and a second end coupleable to a fluid supply located below the server rack and to a fluid supply located above the server rack.

An apparatus, in certain embodiments, includes an intermediate hose that includes a first end coupled to a second conduit of the fluid-based conduits and a second end coupleable to a direct cooling element. An apparatus, in a further embodiment, includes a return hose that includes a first end coupleable to a fluid return line located below the server rack and a fluid return line located above the server rack, and a second end coupled to the direct cooling element.

In one embodiment, heat within the server rack is directed to the fluid-conducting conduits of the door using one or more fans integrated into one or more devices within the server rack. In some embodiments, the server rack is free from additional fans not integrated into the one or more devices within the server rack. In a further embodiment, the door selectively couples to a rear side of the server rack. In another embodiment, the intake hose and the intermediate hose are located along a side of the door that is not coupled to the server rack. In certain embodiments, an amount of heat dissipated through the direct cooling element and the plurality of fluid-conducting conduits of the door is about 100 percent of a heat load generated by one or more devices within the server rack. In some embodiments, the server rack is room-neutral such that a heat load of the server rack is below a level in which climate control settings of an area where the server rack is installed would be adjusted.

A method, in one embodiment, includes providing a fluid received from a fluid supply connected to a second end of an intake hose to a plurality of fluid-conducting conduits of a door of a server rack. The intake hose may be coupled to a first conduit of the fluid-conducting conduits at a first end of the intake hose. In a further embodiment, the intake hose is coupleable to a fluid supply located below the server rack and to a fluid supply located above the server rack.

In one embodiment, the method includes providing fluid received from the plurality of fluid-conducting conduits at a second end of an intermediate hose to a direct cooling element of the server rack. The intermediate hose may be coupled to the direct cooling element at a first end of the intermediate hose. In some embodiments, the method includes providing fluid received from the direct cooling element at a second end of a return hose to a fluid return line. The return hose may be coupled to the fluid return line at a first end of the return hose. In some embodiments, the return hose is coupleable to a fluid return line located below the server rack and a fluid return line located above the server rack.

In one embodiment, the intake hose, the fluid-conducting conduits, the intermediate hose, the direct cooling element, and the return hose are connected to create a single path for the fluid. In a further embodiment, the method includes directing heat within the server rack to the fluid-conducting conduits of the door using one or more fans integrated into one or more devices within the server rack. In some embodiments, the server rack is free from additional fans not integrated into the one or more devices within the server rack.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. The schematic flowchart diagrams and/or schematic block diagrams in the Figures illustrate the architecture, functionality, and operation of possible implementations of apparatuses, systems, and methods.

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment.

The description of elements in each figure may refer to elements of proceeding figures. Like numbers refer to like elements in all figures, including alternate embodiments of like elements.

Figure 1:
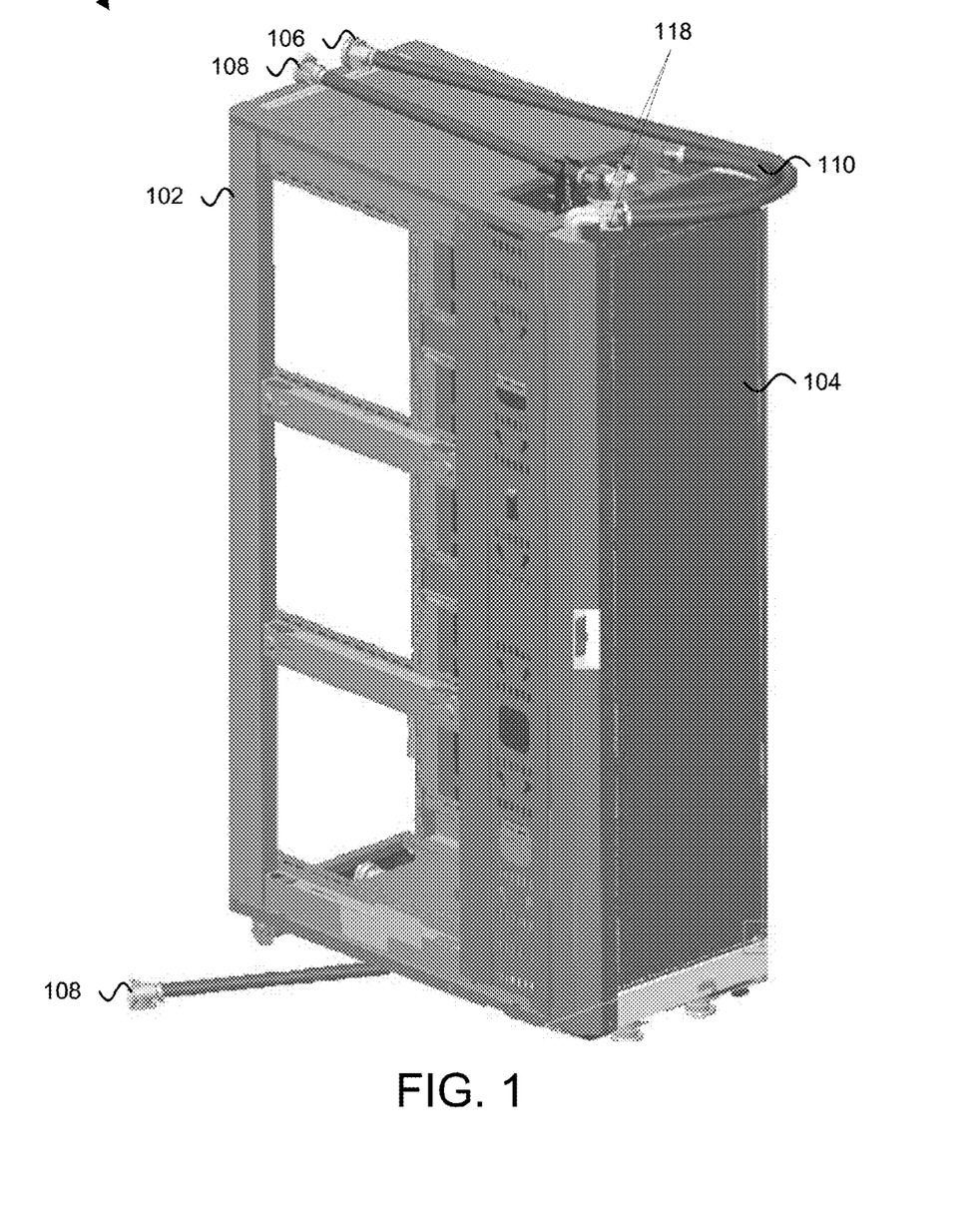
FIG. 1 is a perspective view of one embodiment of a system for heat management in a server rack.

FIG. 1 is a perspective view of one embodiment of a system 100 for heat management in a server rack 102. In one embodiment, the system 100 includes a server rack 102. A server rack 102, as used herein, is a structure where multiple servers are mounted. Various types of servers may be mounted in a server rack 102, such as database servers, file servers, mail servers, print servers, web servers, gaming servers, application servers, cloud servers, or the like. The server rack 102, in some embodiments, is one server rack 102 in a data center that includes multiple different server racks 102. In general, servers and other similar electronic devices generate heat while powered-on. Accordingly, a server rack 102 that includes multiple devices may produce an amount of heat that, if not dissipated from the server rack 102 appropriately, may damage the devices within the server rack 102 and hamper the performance of the data center.

Figure 2:
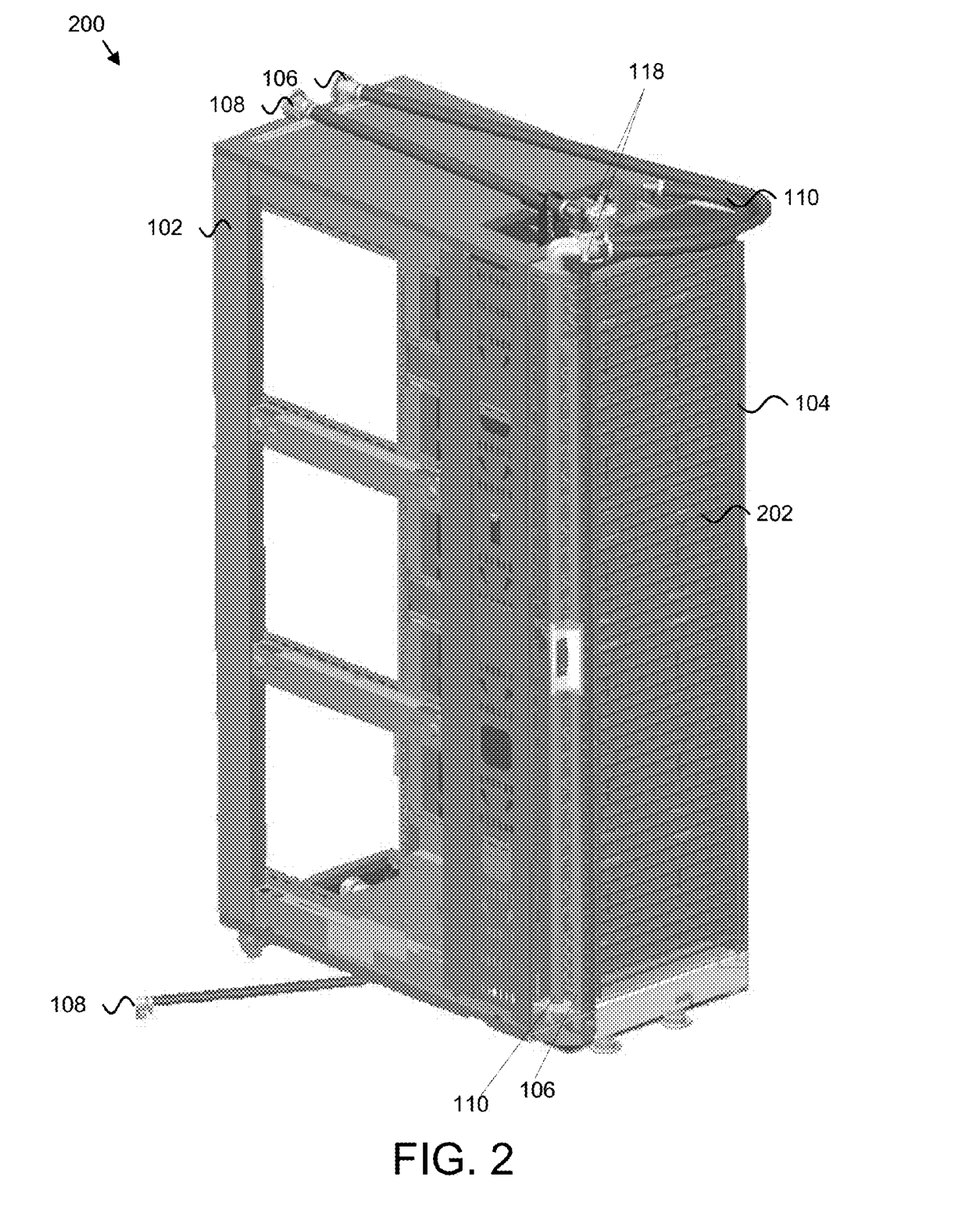
FIG. 2 is a perspective view of one embodiment of a system for heat management in a server rack.
Figure 3:
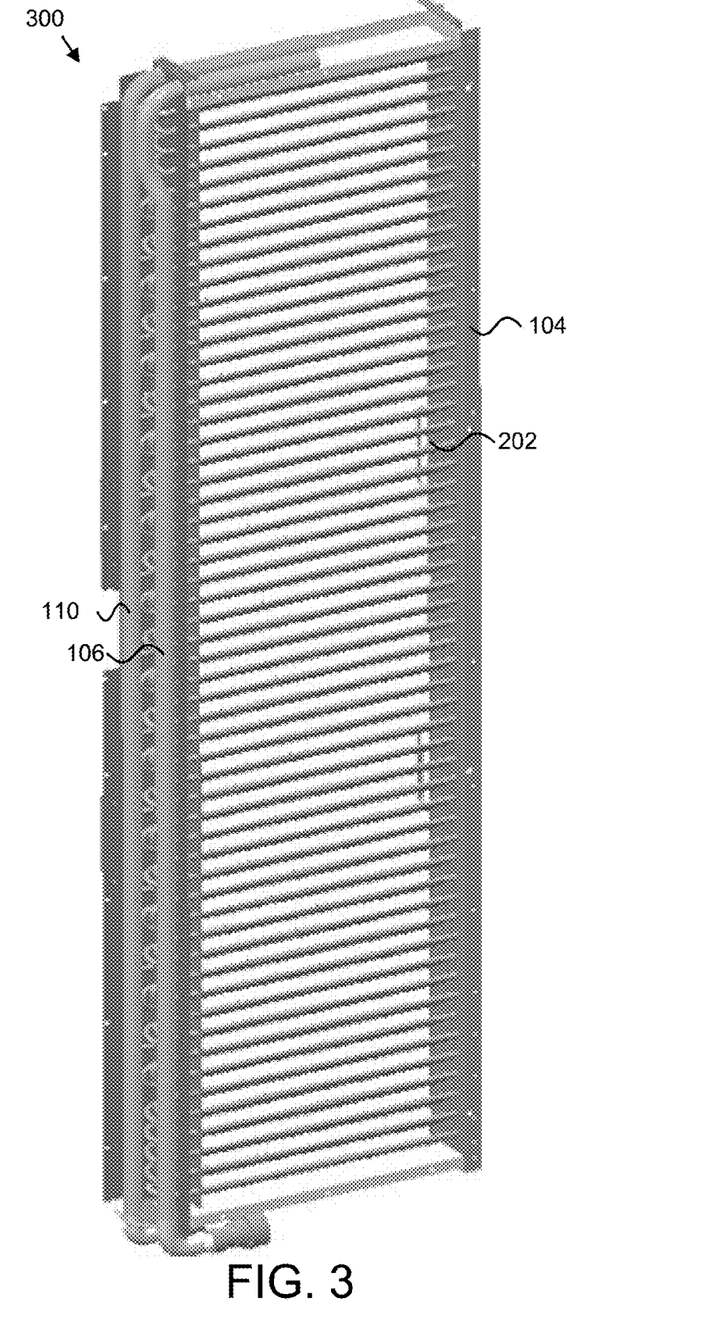
FIG. 3 is a perspective view of one embodiment of a heat exchanger.

Therefore, in one embodiment, the server rack 102 includes a rear-door heat exchanger ("RDHX") 104 that is configured to dissipate heat produced by the devices within the server rack 102. In certain embodiments the RDHX 104 includes a plurality of fluid-conducting conduits 202, otherwise known as fluid-based cooling elements, as shown in FIGS. 2 and 3. The fluid-conducting conduits 202, for example, may be embodied as coils that are filled with water chilled to a predetermined temperature (e.g., water chilled to a temperature above dew point—the temperature at which water vapor condenses into liquid; water chilled to 12° C.-24° C.; etc.). As cooling fluid flows through the fluid-conducting conduits 202 of the RDHX 104, heat may be dissipated through the fluid and drawn out of the server rack 102.

In one embodiment, the RDHX 104 is selectively coupled to the server rack 102 such that the RDHX 104 can be coupled to and uncoupled from the server rack 102 as necessary. In a further embodiment, the RDHX 104 couples to the server rack 102 along one side of the door using hinges or similar attachment mechanisms such that the RDHX 104 can swing open and shut to allow access to the devices within the server rack 102.

Figure 5:
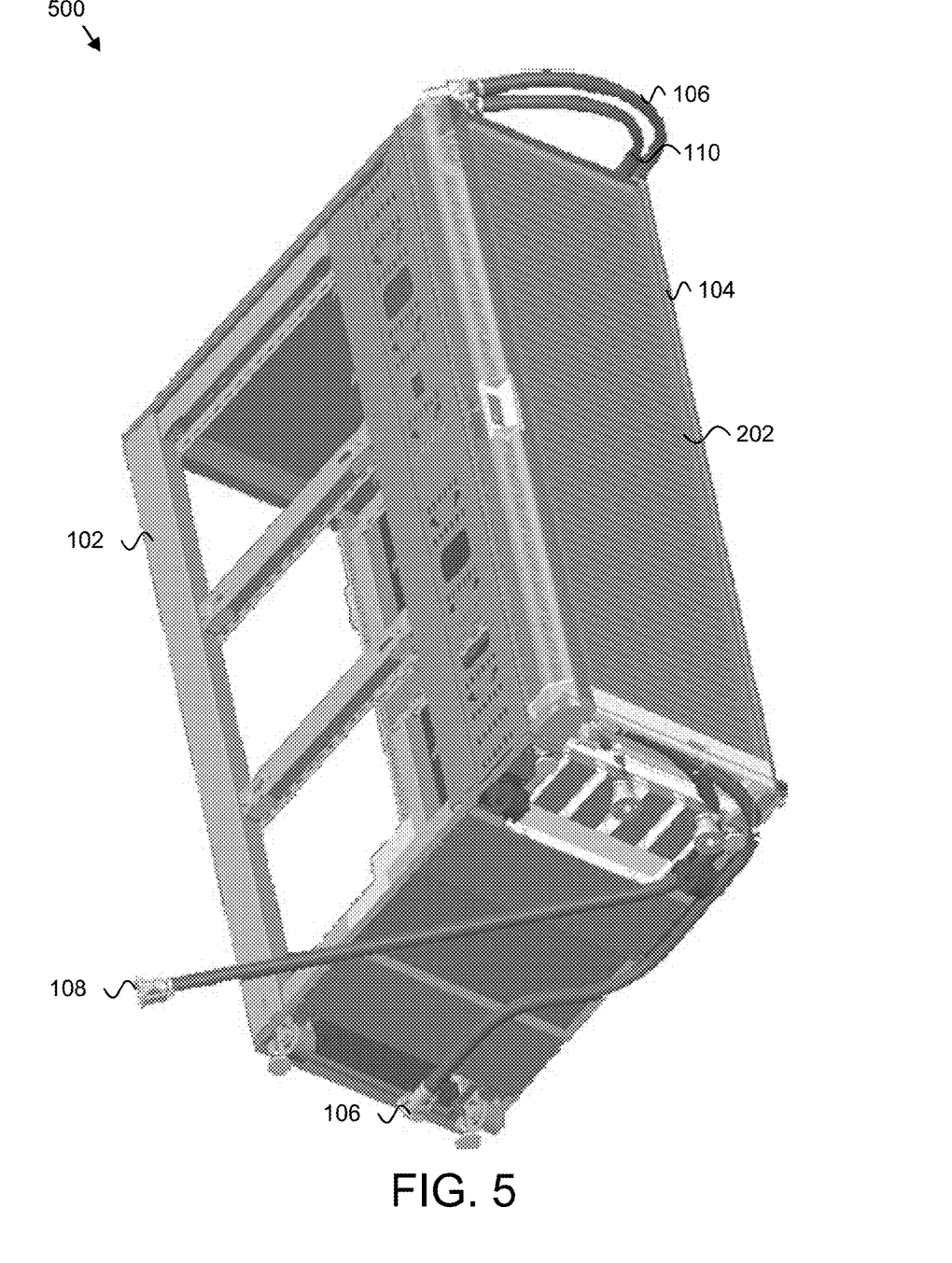
FIG. 5 is a perspective view of one embodiment of a bottom side of a system for heat management in a server rack.

In one embodiment, the system 100 includes one or more hoses 106-110 that are configured to provide cooling fluid to the RDHX 104 and return used fluid. In one embodiment, the system 100 includes a fluid intake hose 106 that is configured to connect to a fluid supply, such as a water supply line (not shown), to provide cooling fluid to the RDHX 104. In the embodiment of the system 100 depicted in FIG. 1, the fluid intake hose 106 is located on the top of the server rack 102. Such a configuration, in some embodiments, allows the fluid intake hose 106 to connect to a fluid supply located above the server rack 102, such as in a ceiling of the facility where the server rack 102 is installed. In another embodiment, the fluid intake hose 106 may be located on the bottom of the server rack 102, as illustrated in FIG. 5. Such a configuration, in certain embodiments, allows the fluid intake hose 106 to couple to a fluid supply available beneath the server rack 102, such as in the floor of the facility where the server rack 102 is installed.

In one embodiment, the fluid intake hose 106 is connected to the RDHX 104 and provides fluid from the fluid supply to the fluid-conducting conduits 202 of the RDHX 104. For example, the fluid intake hose 106 may provide cooled water from the fluid supply to each of the cooling elements of the RDHX 104. In certain embodiments where the fluid intake hose 106 is located on the top of the server rack 102, the fluid intake hose 106 couples to the RDHX 104 near the top of the RDHX 104. Similarly, in some embodiments where the fluid intake hose 106 is located on the bottom of the server rack 102, the fluid intake hose 106 couples to the RDHX 104 near the bottom of the RDHX 104. In certain embodiments, the fluid intake hose 106 may be longer than necessary in order to provide slack such that the RDHX 104 can open and close easily without requiring disconnecting the fluid intake hose 106.

In a further embodiment, the system 100 includes a fluid return hose 108 that is configured to connect to a fluid return line (not shown) to return used cooling fluid, e.g., cooling fluid that has flowed through the RDHX 104 and other cooling elements within the server rack 102. As with the fluid intake hose 106, in one embodiment, the fluid return hose 108 is located on the top of the server rack 102 to connect to a fluid return line located above the server rack 102, such as in a ceiling of the facility where the server rack 102 is installed. In another embodiment, the fluid return hose 108 may be located on the bottom of the server rack 102 to connect to a fluid return line available beneath the server rack 102, such as in the floor of the facility where the server rack 102 is installed.

In some embodiments, the fluid intake hose 106 and the fluid return hose 108 are located on the same side of the server rack 102, e.g., the fluid intake hose 106 and the fluid return hose 108 may both be located on the top or bottom of the server rack 102. In a further embodiment, the fluid intake hose 106 and the fluid return hose 108 are located on the top and bottom of the server rack 102 so that the server rack 102/RDHX 104 cooling system 100 can be installed in facilities that have fluid supply/return lines located above and/or below the server racks 102. In such an embodiment, an unused end of the fluid intake hose 106 and/or the fluid return hose 108 may be capped using a plug, a valve, or the like, to prevent fluid from leaving the unused end. For example, if the fluid intake hose 106 connects to the fluid supply above the server rack 102, an opposite end of the fluid intake hose 106 located on the bottom of the server rack 102 (e.g., at the bottom of the RDHX 104) may be capped using a plug or valve to prevent fluid from escaping.

In one embodiment, the system 100 includes an intermediate hose 110. The intermediate hose 110, in certain embodiments, connects to the RDHX 104 at one end and to a direct cooling element (not shown) within the server rack 102. The direct cooling element, in some embodiments, comprises a fluid-conducting conduit 202 that directly cools various components of the devices within the server rack 102. For example, the direct cooling element may comprise a manifold that directs water through various hoses that are configured to cool processors, memory devices, I/O devices, graphic processors, or the like of the servers within the server rack 102. In such an embodiment, the intermediate hose 110 receives fluid that has been through the fluid-conducting conduits 202 of the RDHX 104 and provides the fluid to the direct cooling element. In a further embodiment, the fluid return hose 108 connects to the direct cooling element to receive used fluid from the direct cooling element within the server rack 102 and provide the used fluid to the fluid return line. In this manner, only a single loop is used to transfer fluid through the cooling system of the server rack 102, instead of using two separate loops: one for the RDHX 104 and one for the direct cooling element.

In some embodiments, the fluid intake hose 106, the fluid return hose 108, and the intermediate hose 110 are connected to the fluid supply, the fluid return line, the RDHX 104, and the direct cooling element using quick connectors 118. As used herein, quick connectors 118 include connection means for coupling hoses to different connection points of the cooling system without requiring threading the hoses to the different connection points. For example, the quick connectors 118 may include cam and groove couplings, interchange connectors, or the like.

In certain embodiments, the devices within the server rack 102 may include fans integrated into the devices to provide air cooling for the components of the devices, as is known in the art. Accordingly, the devices' fans direct heat within the server rack 102 towards the RDHX 104, where it is dissipated by the fluid-conducting conduits 202. In certain embodiments, the devices' fans provide enough air circulation to direct heat towards the RDHX 104 without requiring additional fans that are not integrated into the devices, unlike conventional server racks 102 that have an air-cooled system. For example, if the server rack 102 housed five servers, the fans within the servers may direct heat towards the RDHX 104 where it may be dissipated through the fluid-conducting conduits 202 within the RDHX 104.

In one embodiment, the combination of the direct cooling element within the server rack 102 and the RDHX 104 may provide about 100% heat dissipation within the server rack 102, meaning that the heat load generated by the devices within the server rack 102 that is above a threshold heat load is substantially dissipated through the direct cooling element and/or the RDHX 104. In some embodiments, the direct cooling element may provide a majority of the heat dissipation within the server rack 102, with the remainder being dissipated through the fluid-conducting conduits 202 of the RDHX 104. For example, the direct cooling element may dissipate 85% of the heat load (above the threshold heat load) and the RDHX 104 may dissipate the remaining 15% of the heat load.

The threshold heat load may comprise a heat load that represents an amount of heat produced by the devices within the server rack 102 such that the climate settings of the area where the server rack 102 is installed do not have to be adjusted. Thus, a heat load greater than the threshold heat load may require adjusting the climate settings of the area where the server rack 102 is installed to compensate for the higher temperature in the area. In such an embodiment, the server rack 102 is considered "room neutral," meaning that the server rack 102 can be installed in various areas, rooms, data centers, facilities, etc. without requiring adjusting climate or environment settings, adding additional air conditioners or fans, or the like in the area where the server rack 102 is installed. Accordingly, the power requirement of the system 100 depicted in FIG. 1 may also be less than conventional rack cooling systems because additional fans, air conditioners, or other climate control devices can be reduced or eliminated.

Furthermore, in certain embodiments, the combination of the RDHX 104 and the direct cooling element within the server rack 102 decreases the flow rate of the fluid transmitted through the cooling system. Conventional fluid-based cooling systems may only include a RDHX 104 or a direct cooling element within the server rack 102. In order to achieve 100% heat dissipation from the server rack 102, the flow rate of the fluid may be increased, e.g., to around 15 gallons per minute or the like, to ensure the heat is dissipated appropriately. Unlike conventional fluid-based cooling systems, the combination of the RDHX 104 and the direct cooling element may not require such a high flow rate of fluid through the cooling system because heat is dissipated through two different cooling elements, the direct cooling element and the RDHX 104. In certain embodiments, the flow rate of the system 100 depicted in FIG. 1 may be about 9 gallons per minute.

FIG. 2 is a perspective view of one embodiment of a system 200 for heat management in a server rack 102. In one embodiment, the system 200 depicted in FIG. 2 is substantially similar to the system 100 illustrated above with reference to FIG. 1. The system 200 depicts a RDHX 104 with the rear cover removed to expose the fluid-conducting conduits 202. In one embodiment, the fluid-conducting conduits 202 are coils, or the like, that receive chilled fluid from the fluid intake hose 106. As the fluid travels through the coils, heat is dissipated from the server rack 102 through the fluid.

FIG. 2 also depicts the location of the fluid intake hose 106 and the intermediate hose 110 coupled along a side of the RDHX 104. In some embodiments, the fluid intake hose 106 and the intermediate hose 110 are coupled to the RDHX 104 along a side of the RDHX 104 that is not coupled to the server rack 102 such that the RDHX 104 can open and close without interfering with the fluid intake hose 106 and/or the intermediate hose 110. As discussed above, in one embodiment, the intermediate hose 110 receives fluid that has been through the fluid-conducting conduits 202 of the RDHX 104 and provides the fluid to a direct cooling element within the server rack 102.

FIG. 3 is a perspective view of one embodiment 300 of a read-door heat exchanger 104, which may be substantially similar to the RDHX 104 described above with reference to FIGS. 1 and 2. The RDHX 104, in one embodiment, includes a plurality of fluid-conducting conduits 202 that dissipate heat from within the server rack 102. The fluid-conducting conduits 202 may be various sizes, dimensions, shapes, materials, or the like.

The RDHX 104 depicted in FIG. 3 illustrates the fluid intake hose 106 and the intermediate hose 110 located along a side of the RDHX 104. In the depicted embodiment, the fluid intake hose 106 comprises two ends that may be coupled to a fluid supply (not shown). For example, the fluid intake hose 106 may be coupled to a fluid supply located in the ceiling above the server rack 102 or to a fluid supply located in the floor below the server rack 102. In such an embodiment, the end of the fluid intake hose 106 that is not coupled to a fluid supply may be capped using a plug, a valve, or the like to prevent fluid from escaping through the unused end of the hose 106.

Figure 4:
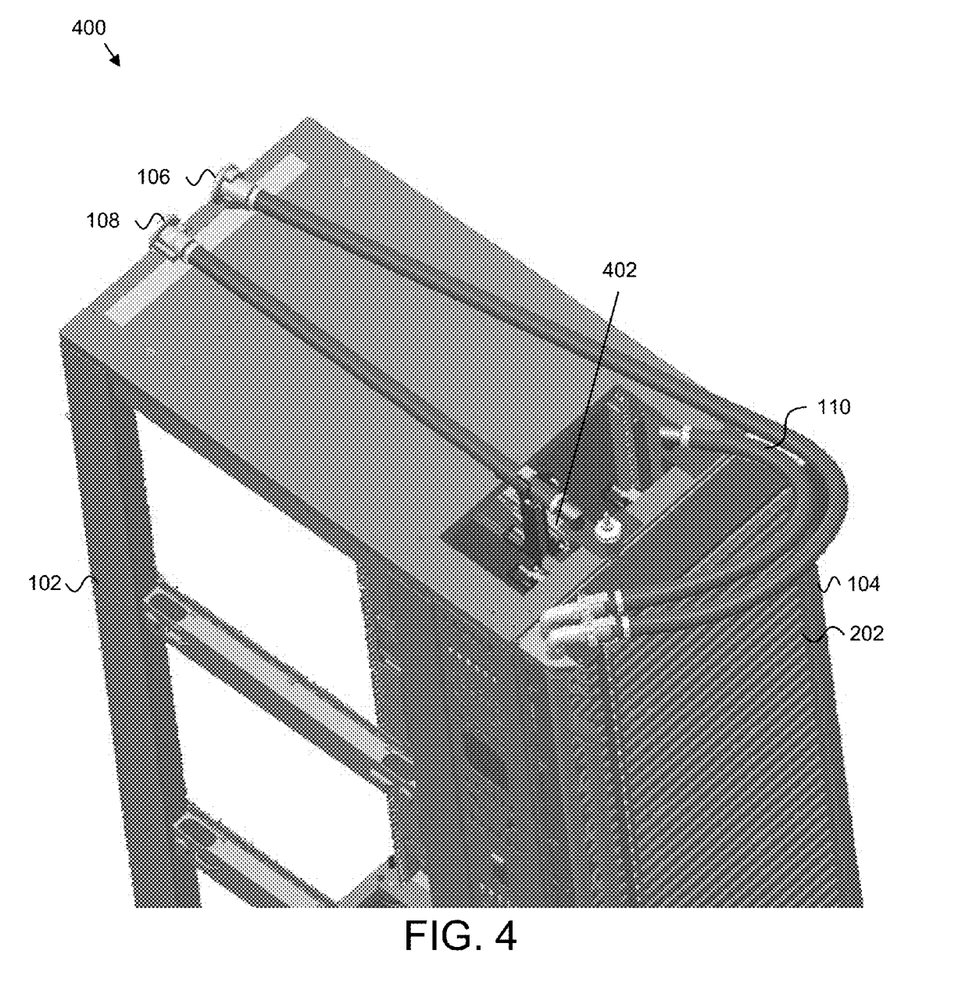
FIG. 4 is a perspective view of one embodiment of a top side of a system for heat management in a server rack.

FIG. 4 is a perspective view of one embodiment of a top side of a system 400 for heat management in a server rack 102. The system 400 depicted in FIG. 4 may be substantially similar to the systems 100, 200 described above with reference to FIGS. 1 and 2. The system 400 of FIG. 4 depicts a server rack 102 that includes a fluid intake hose 106 that is coupleable to a fluid supply located above the server rack 102 and a fluid return line 108 that is also coupleable to a fluid return line located above the server rack 102.

As described above, the fluid intake hose 106 may receive cooling fluid from the fluid supply and provide the cooling fluid to the fluid-conducting conduits of the RDHX 104. After the fluid has traversed the fluid-conducting conduits 202 of the RDHX 104, the intermediate hose 110 transfers the fluid from the RDHX 104 to a direct cooling element 402 located within the server rack 102. The direct cooling element 402 may be a fluid-conducting conduit that provides direct cooling to various components of the devices within the server rack 102, such as processors, memory devices, storage devices, I/O devices, etc. The fluid return hose 108, in some embodiments, transfers used fluid from the direct cooling element 402 to a fluid return line above the server rack 102. In this manner, the combination of a direct cooling element 402 and a RDHX 104 may provide a more efficient and effective cooling solution that is "room neutral" (e.g., it can be installed in various areas without adjusting the climate settings of the area) and does not required any additional cooling elements, such as additional fans, air conditioners, or the like. Moreover, as shown in FIG. 5, the depicted cooling system of the server rack 102 may be coupleable to fluid supplies and fluid return lines located above the server rack 102 and below the server rack 102.

FIG. 5 is a perspective view of one embodiment of a bottom side of a system 500 for heat management in a server rack 102. The system depicted in FIG. 5 may be the bottom side of the system 400 depicted in FIG. 4. The illustrated system 500 may include a fluid intake hose 106 and a fluid return hose 108 that are configured to connect to a fluid supply and a fluid return line, respectively, located beneath the server rack 102, such as in the floor of the facility where the server rack 102 is located. In both systems 400, 500 depicted in FIGS. 4 and 5, the unused ends of the fluid intake hose 106 and the fluid return hose 108 are capped using a plug, a valve, or the like, to prevent fluid from escaping or leaking through the end of the hoses 106, 108. Thus, if the fluid intake hose 106 is connected to a fluid supply located beneath the server rack 102, the opposite end of the fluid intake hose 106 located above the server rack 102 would be capped.

Figure 6:
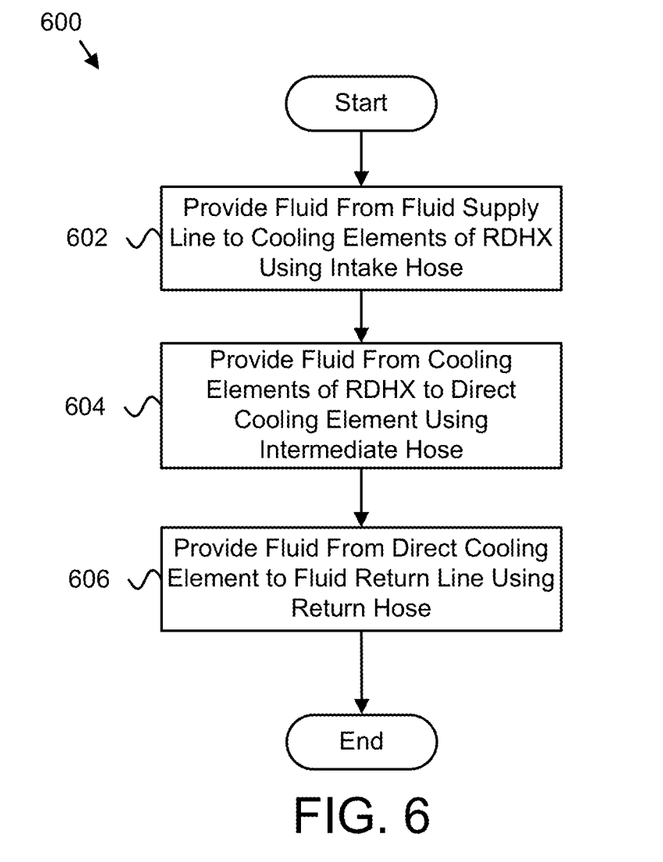
FIG. 6 is a schematic flow chart diagram illustrating one embodiment of a method for heat management in a server rack.

FIG. 6 is a schematic flow chart diagram illustrating one embodiment of a method 600 for heat management in a server rack 102. In one embodiment, the method 600 begins and provides 602 fluid from a fluid supply to a plurality of fluid-conducting conduits 202 of a RDHX 104 via a fluid intake hose 106. In certain embodiments, the fluid intake hose 106 is located on the top and/or the bottom of the server rack 102 and connects to a fluid supply located above the server rack 102 or below the server rack 102. The method 600, in a further embodiment, provides 604 fluid from the fluid-conducting conduits 202 of the RDHX 104 to a direct cooling element 402 via an intermediate hose 110. The method 600, in various embodiments, provides 606 fluid from the direct cooling element 402 to a fluid return line via a fluid return hose 108, and the method 600 ends. In certain embodiments, the fluid return hose 108 is located on the top and/or the bottom of the server rack 102 and connects to a fluid return line located above the server rack 102 or below the server rack 102.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
    a server rack comprising a direct cooling element;
    a door coupleable to the server rack, the door comprising a plurality of fluid-conducting conduits;
    an intake hose comprising a first end coupled to a first conduit of said fluid-conducting conduits and one of a plurality of second ends coupled to a fluid supply, wherein the intake hose is coupleable, at one end of the plurality of second ends, to a fluid supply located on a floor side of the server rack and, at another end of the plurality of second ends, to a fluid supply located on a ceiling side of the server rack;
    an intermediate hose comprising a first end coupled to a second conduit of said fluid-conducting conduits and a second end coupled to the direct cooling element; and
    a return hose comprising a plurality of first ends coupled to a fluid return line and a second end coupled to the direct cooling element, wherein the return hose is coupleable, at one end of the plurality of first ends, to a fluid return line located on the floor side of the server rack and, at another end of the plurality of first ends, to a fluid return line located on the ceiling side of the server rack,
    wherein the intake hose, the fluid-conducting conduits, the intermediate hose, the direct cooling element, and the return hose are connected to create a single path for the fluid.

2. The system of claim 1, wherein heat within the server rack is directed to the fluid-conducting conduits of the door using one or more fans integrated into one or more devices within the server rack, the server rack free from additional fans not integrated into the devices within the server rack.

3. The system of claim 1, wherein the door selectively couples to a rear side of the server rack.

4. The system of claim 1, wherein the intake hose and intermediate hose are located along a side of the door that is not coupled to the server rack.

5. The system of claim 1, wherein the fluid supply and the fluid return line are located together in one or more of a floor below the server rack and a ceiling above the server rack.

6. The system of claim 1, wherein an amount of heat dissipated through the direct cooling element and the plurality of fluid-conducting conduits of the door is about 100 percent of a heat load generated by one or more devices within the server rack.

7. The system of claim 1, wherein the server rack is room-neutral such that a heat load of the server rack is below a level in which climate control settings of an area where the server rack is installed would be adjusted.

8. The system of claim 1, further comprising one or more connectors coupled to each end of the hoses, the connectors coupling the hoses to the fluid supply, the door, the direct cooling element, and the fluid return line without threading.

9. The system of claim 1, further comprising one or more of a plug and a valve configured to prevent an outflow of the fluid from an end of the plurality of second ends of the intake hose that is not coupled to the fluid supply and an end of the plurality of first ends of the return hose that is not coupled to the fluid return line.

10. The system of claim 1, wherein a rate of flow of the fluid is about nine gallons per minute.

11. The system of claim 1, wherein the fluid comprises water cooled to a predetermined temperature.

12. An apparatus comprising:
    a door coupleable to a server rack, the door comprising a plurality of fluid-conducting conduits;
    an intake hose comprising a first end coupled to a first conduit of said fluid-conducting conduits and a plurality of second ends coupleable, at one end of the plurality of second ends, to a fluid supply located on a floor side of the server rack and, at another end of the plurality of second ends, to a fluid supply located on a ceiling side of the server rack; and
    an intermediate hose comprising a first end coupled to a second conduit of said fluid-conducting conduits and a second end coupleable to a direct cooling element of the server rack.

13. The apparatus of claim 12, further comprising a return hose comprising a plurality of first ends coupleable, at one end of the plurality of first ends, to a fluid return line located on the floor side of the server rack and, at another end of the plurality of first ends, to a fluid return line located on the ceiling side of the server rack, and a second end coupled to the direct cooling element.

14. The apparatus of claim 12, wherein heat within the server rack is directed to the fluid-conducting conduits of the door using one or more fans integrated into one or more devices within the server rack, the server rack free from additional fans not integrated into the one or more devices within the server rack.

15. The apparatus of claim 12, wherein the door selectively couples to a rear side of the server rack.

16. The apparatus of claim 12, wherein the intake hose and the intermediate hose are located along a side of the door that is not coupled to the server rack.

17. The apparatus of claim 12, wherein an amount of heat dissipated through the direct cooling element and the plurality of fluid-conducting conduits of the door is about 100 percent of a heat load generated by one or more devices within the server rack.

18. The apparatus of claim 12, wherein the server rack is room-neutral such that a heat load of the server rack is below a level in which climate control settings of an area where the server rack is installed would be adjusted.

19. A method comprising:
    providing fluid received from a fluid supply connected to one of a plurality of second ends of an intake hose to a plurality of fluid-conducting conduits of a door of a server rack, the intake hose coupled to a first conduit of said fluid-conducting conduits at a first end of the intake hose, wherein the intake hose is coupleable, at one end of the plurality of second ends, to a fluid supply located on a floor side of the server rack and, at another end of the plurality of second ends, to a fluid supply located on a ceiling side of the server rack;

providing fluid received from the plurality of fluid-conducting conduits at a second end of an intermediate hose to a direct cooling element of the server rack, the intermediate hose coupled to the direct cooling element at a first end of the intermediate hose; and providing fluid received from the direct cooling element at a second end of a return hose to a fluid return line, the return hose coupled to the fluid return line at a one of a plurality of first ends of the return hose, wherein the return hose is coupleable, at one end of the plurality of first ends to a fluid return line located on the floor side of the server rack and a fluid return line located on the ceiling side of the server rack, wherein the intake hose, the fluid-conducting conduits, the intermediate hose, the direct cooling element, and the return hose are connected to create a single path for the fluid.

20. The method of claim 19, further comprising directing heat within the server rack to the fluid-conducting conduits of the door using one or more fans integrated into one or more devices within the server rack, the server rack free from additional fans not integrated into the one or more devices within the server rack.

\* \* \* \* \*